United States Patent [19]
Miyachi et al.

[11] Patent Number: 5,485,495
[45] Date of Patent: Jan. 16, 1996

[54] X-RAY MASK, AND EXPOSURE APPARATUS AND DEVICE PRODUCTION USING THE MASK

[75] Inventors: Takeshi Miyachi, Zama; Nobutoshi Mizusawa, Yamato; Shinichi Hara; Hiroshi Maehara, both of Yokohama, all of Japan

[73] Assignee: Canon Kabushiki Kaisha, Tokyo, Japan

[21] Appl. No.: 286,904

[22] Filed: Aug. 8, 1994

Related U.S. Application Data

[63] Continuation of Ser. No. 32,654, Mar. 17, 1993, abandoned.

[30] Foreign Application Priority Data

Mar. 31, 1992 [JP] Japan ................................ 4-077560
Jan. 26, 1993 [JP] Japan ................................ 5-010994

[51] Int. Cl.⁶ .......................................................... G21K 5/00
[52] U.S. Cl. ................................................ 378/34; 378/35
[58] Field of Search ...................................... 378/34, 35

[56] References Cited

U.S. PATENT DOCUMENTS

| | | | |
|---|---|---|---|
| 4,881,257 | 11/1989 | Nakagawa | 378/35 |
| 4,969,168 | 11/1990 | Sakamoto et al. | 378/34 |
| 5,026,239 | 6/1991 | Chiba et al. | 414/217 |
| 5,063,582 | 11/1991 | Mori et al. | 378/34 |
| 5,150,391 | 9/1992 | Ebinuma et al. | 378/34 |
| 5,160,961 | 11/1992 | Marumo et al. | 355/53 |
| 5,285,488 | 2/1994 | Watanabe et al. | 378/34 |

*Primary Examiner*—Craig E. Church
*Attorney, Agent, or Firm*—Fitzpatrick, Cella, Harper & Scinto

[57] ABSTRACT

A method of producing an X-ray mask includes a step of forming a mask pattern on a mask substrate having an amount of warp, and a step of bonding the mask substrate to a mask frame. In both steps, the mask substrate maintains a shape obtained due to the amount of warp. Since the mask substrate is fixed to the mask frame in a warped state, distortion is not produced in the mask pattern. As a result, an X-ray mask, which is suitable for very precise exposure, is provided.

16 Claims, 16 Drawing Sheets

PRODUCTION FLOW OF
SEMICONDUCTOR DEVICES

WAFER PROCESS

X-RAY MASK, AND EXPOSURE APPARATUS AND DEVICE PRODUCTION USING THE MASK

This application is a continuation of prior application, Ser. No. 08/032,654 filed Mar. 17, 1993, now abandoned.

BACKGROUND OF THE INVENTION

1. Field of the Invention

This invention relates to an X-ray mask which is used in an X-ray exposure apparatus or the like.

2. Description of the Prior Art

A conventional X-ray mask used in an X-ray exposure apparatus which is mainly utilized in semiconductor-device production is produced according to the following process.

First, a portion of a mask substrate corresponding to a portion of a membrane formed on the upper surface of the mask substrate, on which a mask pattern is to be formed, is removed by back-etching. Thereafter, an X-ray absorber is selectively provided on the portion where the mask pattern is to be formed on the upper surface of the membrane. After drawing the mask pattern on the X-ray absorber by scanning it with an electron beam, a frame is bonded to the mask substrate.

It has been known that back-etching included in the above-described process produces a warp in the mask substrate due to the tensile stress of the membrane. The amount of the warp is 3 μm when the thickness of the mask substrate is 2 mm, which is a typical value, and becomes at least 6 μm when the thickness is 1 mm, which is thinner than the typical value.

Conventionally, an X-ray mask in which such a warp or distortion is present is used with an apparatus which alters or removes the warp or distortion in the mask during exposure.

FIGS. 16(a) through 16(f) are diagrams sequentially illustrating a conventional X-ray mask production process.

In FIG. 16(a), mask substrate 801 is subjected to back-etching after forming membrane 802 on the upper surface thereof. Thereafter, a film of X-ray absorber 803a for forming an X-ray absorber pattern is formed on the upper surface of membrane 802, and resist 812 is coated on X-ray absorber 803a. The X-ray absorber film 803a is formed by etching or plating. A description will now be provided of etching which is generally used.

As shown in FIG. 16(b), mask substrate 801 having the above-described configuration is mounted in cassette 804 having an opening in a portion of the upper surface thereof. Cassette 804 is used for fixing mask substrate 801 when a pattern is formed on X-ray absorber 803a by electron beam scanning. Mask substrate 801 is fixed by pressing its upper surface against the inner surface of the upper plate of cassette 804 by a plurality of leaf springs, such as $805_1$ and $805_2$, accommodated within cassette 804. Mask substrate 801 maintains the above-described warped state while being accommodated within cassette 804. Electron beam scanning is performed in that state, and a predetermined pattern is formed on X-ray absorber 803a. X-ray absorbing pattern 803b shown in FIG. 16(c) is formed by removing unnecessary portions of X-ray absorber 803a by etching.

As shown in FIG. 16(d), mask substrate 801 on which the above-described X-ray absorbing pattern 803b has been formed is bonded to frame 807. At that time, mask substrate 801 and frame 807 are bonded together using an adhesive, anodic connection or the like and are sandwiched between mask chuck 806 and frame chuck 808 to correct the warp.

Mask substrate 801 and frame 807, bonded together as one body, are then released from mask chuck 806 and frame chuck 808, respectively. At that time, both mask substrate 801 and frame 807 are in a warped state due to the stress of membrane 802, as shown in FIG. 16(e).

Then, mask substrate 801 and frame 807 are mounted on an exposure apparatus, and are utilized for actual exposure. As shown in FIG. 16(f), mask substrate 801 and frame 807 are mounted by suction or magnetic attraction of the lower surface of frame 807 to produce a state in which the warp is corrected. As a result, a patterned region 810, which is irradiated by an electron beam, is deformed in the direction of the outer circumference of the substrate by an amount of pattern shift region 811, causing distortion.

FIGS. 17(a) through 17(f) are diagrams sequentially illustrating another conventional X-ray mask production process.

In the conventional process shown in FIGS. 16(a) through 16(f), an electron beam is used to form a pattern before the mask substrate and the frame are bonded together. In the process shown in FIGS. 17(a) through 17(f), however, the mask substrate and the frame are bonded together before an electron beam is used to form a pattern.

Since the configuration shown in FIGS. 17(a) through 17(f) is the same as the configuration shown in FIGS. 16(a) through 16(f), the same components as those shown in FIGS. 16(a) through 16(f) are indicated by the same reference numerals, and an explanation thereof will be omitted.

Mask substrate 801 having membrane 802 and X-ray absorber film 803a on the upper surface thereof, shown in FIG. 17(a), is bonded to frame 807 while being sandwiched between mask chuck 806 and frame chuck 808, as shown in FIG. 17(b).

After being bonded together, mask substrate 801 and frame 807 are released from mask chuck 806 and frame chuck 808, respectively. At that time, both mask substrate 801 and frame 807 are in a warped state, as shown in FIG. 17(c). However, the amount of the warp is reduced compared with the configuration shown in FIG. 16(e) because some of the tensile stress of the membrane is absorbed by the rigidity of frame 807.

Then, mask substrate 801 and frame 807 are fixed within cassette 804, as shown in FIG. 17(d), using leaf springs accommodated within cassette 804 as in the case shown in FIG. 16(b). In the present case, however, since frame 807 is accommodated within cassette 804 together with mask substrate 801, leaf springs $905_1$ and $905_2$ which are shorter than the leaf springs shown in FIG. 16(b) are used. Electron beam scanning is performed to form a pattern on X-ray absorber folm 803a, and excess portions of film 803a are removed to form pattern 803b, as shown in FIG. 17(e).

Mask substrate 801 and frame 807 are then used for actual exposure, but pattern shift region 811, as shown in FIG. 17(f), causes distortion.

SUMMARY OF THE INVENTION

As described above, if an X-ray mask is used with an apparatus which alters the amount of its warp during exposure, a pattern shift region is produced in accordance with the amount of correction. For example, if a warp of 1 μm is corrected, a pattern shift region of 0.09 μm is produced. Accordingly, such a mask cannot be used for an X-ray exposure apparatus fop producing large-capacity memory devices for which an accuracy of 0.01 μm, for example, is required.

The present invention has been made in consideration of the above-described problems in the prior art.

It is an object of the present invention to provide an X-ray mask which is suitable for high-precision exposure, and in which distortion in a mask pattern is not produced.

It is another object of the present invention to provide an exposure apparatus and a device production method in which the above-described X-ray mask is used.

According to a first aspect of the present invention, an X-ray mask includes a mask substrate member having a mask pattern formed thereon and an amount of warp. A mask frame is bonded to the mask substrate member such that the intrinsic amount of warp in the mask substrate member is preserved.

According to another aspect of the present invention, an X-ray mask includes a mask frame and a mask substrate member having a mask pattern formed thereon. The mask substrate member also has a predetermined internal bias force when free from external forces. A bonding agent joins the mask frame and the mask substrate member without affecting the predetermined internal bias force of the mask substrate member.

According to yet another aspect of the present invention, an X-ray mask includes a mask substrate member having a mask pattern formed thereon. The mask substrate member also has a plurality of contour lines. A mask frame is bonded to the mask substrate member at a plurality of points, which are located on a single one of the plurality of contour lines.

According to still another aspect of the present invention, a method of producing an X-ray mask is provided which includes providing a mask substrate member having an amount of warp, forming a mask pattern on the mask substrate member while preserving the amount of warp and bonding a mask frame to the mask substrate member while preserving the amount of warp.

According to a further aspect of the present invention, an X-ray mask is provided which is produced by a method which includes back-etching a portion of a mask substrate member to obtain a mask substrate member having an amount of warp, forming a mask pattern on the mask substrate member while preserving the amount of warp and bonding a mask frame to the mask substrate member while preserving the amount of warp.

According to yet a further aspect of the present invention, an exposure apparatus is provided. The exposure apparatus includes an X-ray mask which has a mask substrate member having a pattern formed thereon. The mask substrate member also has an intrinsic amount of warp. A mask frame is bonded to the mask substrate member such that the intrinsic amount of warp is preserved. The apparatus also includes a radiation source for emitting a sheet beam of radiation in an orbital plane. Spreading means spreads the sheet beam in a direction perpendicular to the orbital plane.

According to still a further aspect of the present invention, a method of producing a semiconductor device is provided. The method includes providing an X-ray mask having a mask substrate member with a circuit pattern formed thereon and having an amount of warp, wherein a mask frame is bonded to the mask substrate member such that the amount of warp is preserved. The method further includes providing a wafer. The X-ray mask is exposed with radiation to transfer the circuit pattern to the wafer, and post-exposure processing is performed on the wafer to form the semiconductor device.

The foregoing and other objects, advantages and features of the present invention will become more apparent from the following description of the preferred embodiments taken in conjunction with the accompanying drawings.

BRIEF DESCRIPTION OF THE DRAWINGS

FIG. 1(a) illustrates a process of forming a mask pattern, and FIG. 1(b) illustrates a process of bonding a mask substrate shown in FIG. 1(a) to a mask frame;

FIG. 3(a) illustrates a process of forming a mask pattern, and FIG. 3 (b) illustrates a process of bonding a mask substrate shown in FIG. 3(a) to a mask frame;

FIG. 6(a) illustrates a process of bonding a mask substrate to a mask frame, FIG. 6(b) illustrates a process of forming a mask pattern;

DESCRIPTION OF THE PREFERRED EMBODIMENTS

Figure 1A:
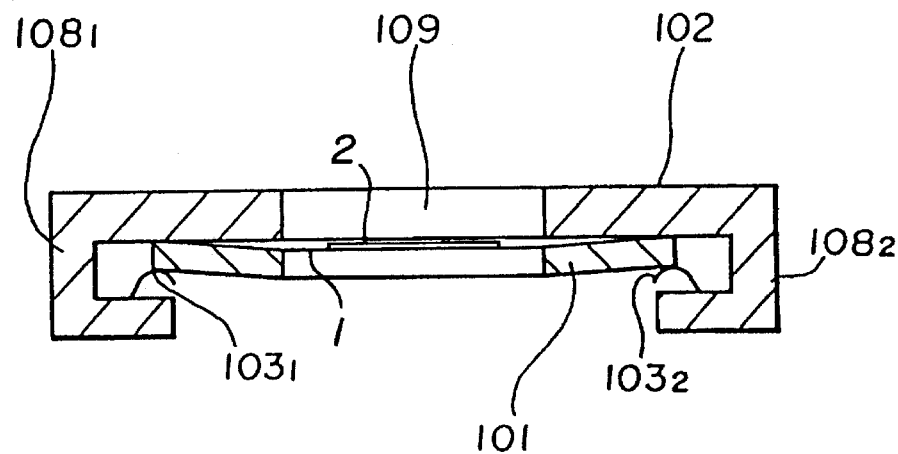
FIGS. 1(a) and 1(b) are cross-sectional views showing the configuration of a first preferred embodiment of the present invention.
Figure 1B:
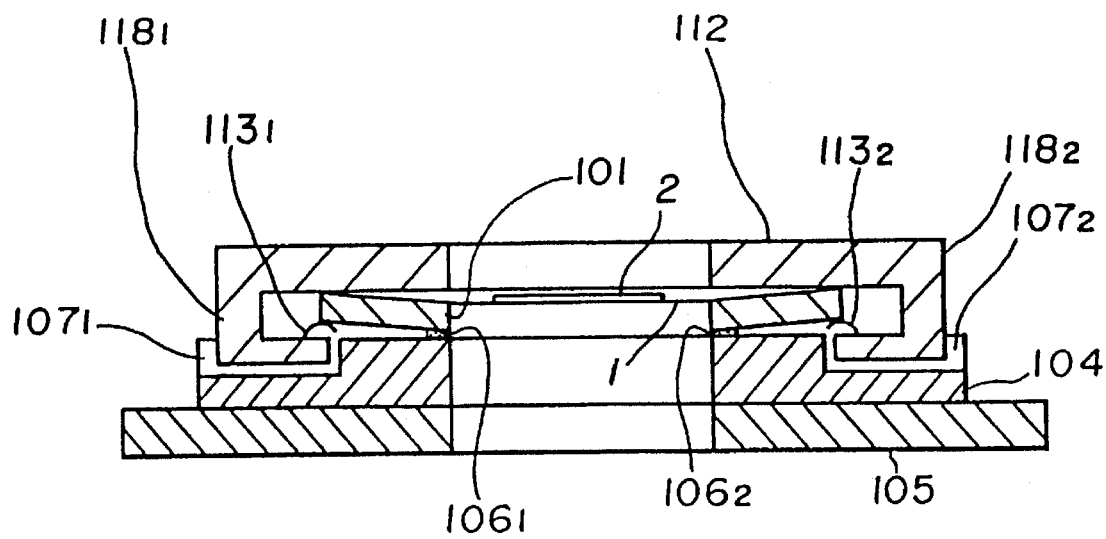

FIGS. 1(a) and 1(b) are cross-sectional views showing the configuration of a first preferred embodiment of the present invention.

Figure 16A:
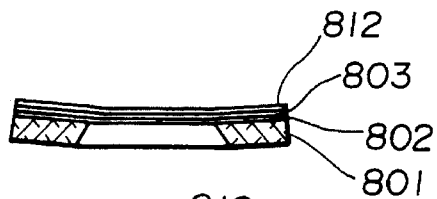
FIGS. 16(a) through 16(f) are diagrams sequentially illustrating a conventional process of forming an X-ray mask.
Figure 16B:
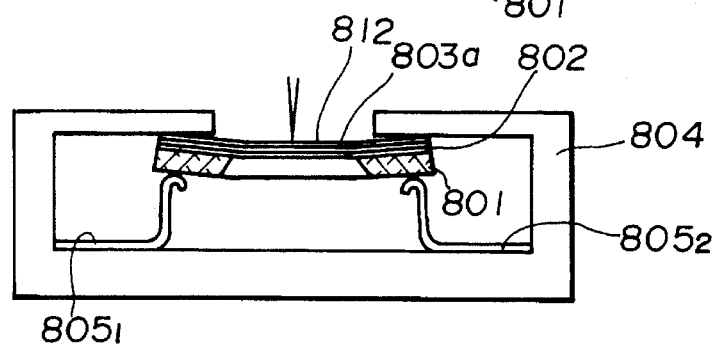
Figure 16C:
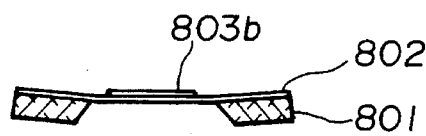
Figure 16D:
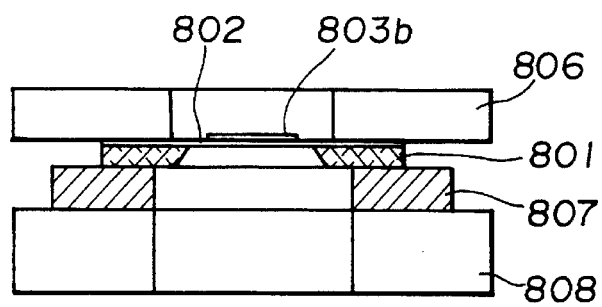
Figure 16E:
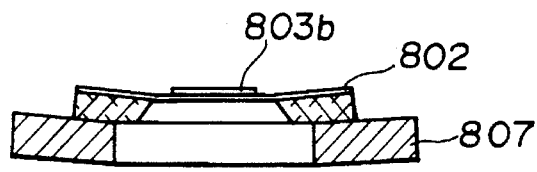
Figure 16F:
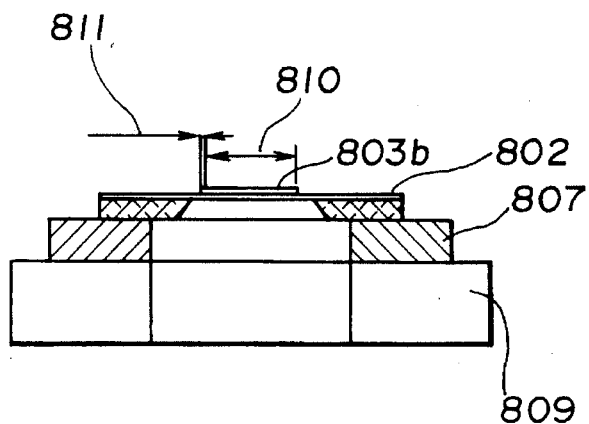
Figure 17A:
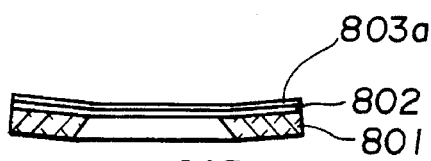
FIGS. 17(a) through 17(f) are diagrams sequentially illustrating another conventional process of forming an X-ray mask.
Figure 17B:
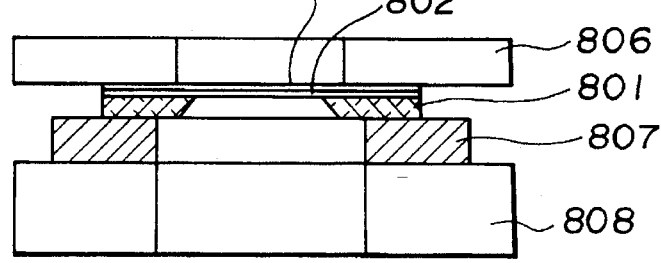
Figure 17C:
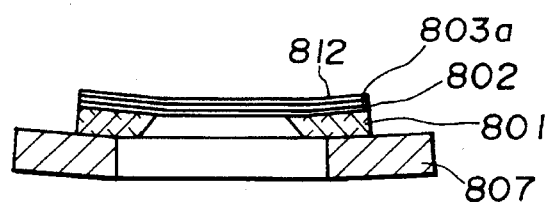
Figure 17D:
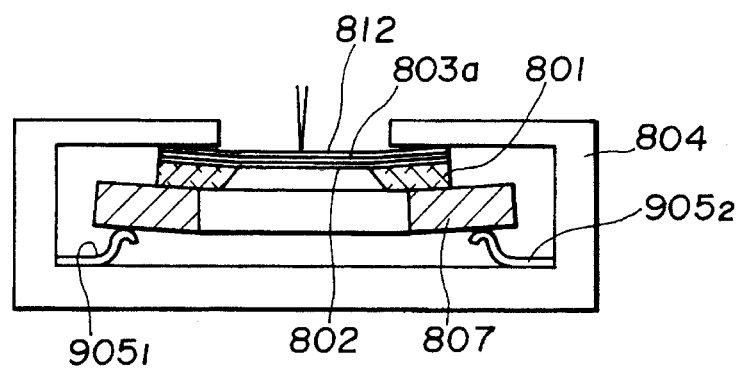
Figure 17E:
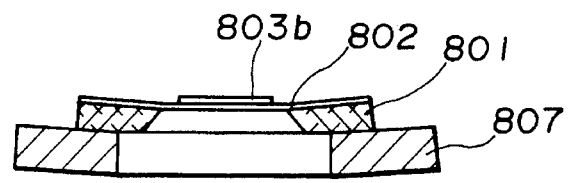
Figure 17F:
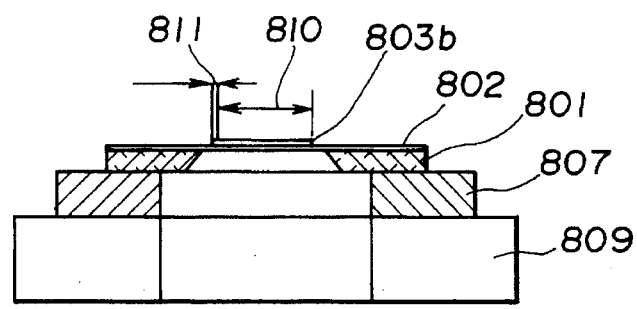

As in the case of mask substrate 801 shown in FIG. 16(a), mask substrate 101 used in the present embodiment is subjected to back-etching after forming a membrane 1 on the upper surface thereof. Thereafter, a film of an X-ray absorber for forming a mask pattern is provided on the upper surface of the membrane. An X-ray absorbing pattern 2 is selectively formed by etching unnecessary portions of the X-ray absorber.

In the present embodiment, as shown in FIG. 1(a), mask substrate 101 is mounted in cassette 102, and a mask pattern is drawn by electron beam scanning. Thereafter, as shown in FIG. 1(b), mask substrate 101 is bonded to mask frame 104.

The above-described process is performed for mask substrate 101 having a warped shape due to the tensile stress of the membrane.

Opening 109 for passing an electron beam and cantilever-type supporting members $108_1$ and $108_2$ are provided on a rectangular plate-like member of cassette 102.

Leaf springs $103_1$ and $103_2$ for pressing mask substrate 101 against the inner surface of the upper plate of cassette 102 are provided on the inner surfaces of supporting members $108_1$ and $108_2$ within cassette 102. The inner surface of the upper plate of cassette 102 is arranged to be parallel to the reference surface of an electron beam scanning apparatus when cassette 102 is mounted in the apparatus, whereby the mask pattern formed on mask substrate 101 is arranged to conform to a standard.

Supporting members $108_1$ and $108_2$, and leaf springs $103_1$ and $103_2$ are provided at positions such that the amount of warp produced in mask substrate 101 is unchanged by mounting in cassette 102. For that purpose, supporting members $108_1$ and $108_2$ are provided at outer circumferential portions of cassette 102 with an equal interval therebetween, and leaf springs $103_1$ and $103_2$ are disposed on supporting members $108_1$ and $108_2$, respectively, so as to press against outer circumferential portions of the lower surface of mask substrate 101. According to such a configuration, application of an unnecessary external force to mask substrate 101 is prevented, and mask substrate 101 maintains its warped shape caused by the tensile stress of the membrane.

The number of leaf springs 103 is not limited to two, but rather three or more leaf springs 103 may be disposed with an equal interval therebetween. Furthermore, instead of providing cantilever-type supporting members 108, an opening may be provided at the base of cassette 102, and leaf springs 103 may be provided around this opening.

Mask substrate 101 mounted in cassette 102 on which the mask pattern has been drawn is subjected to processing for forming an X-ray absorbing pattern, and is thereafter bonded to mask frame 104 provided on mask frame chuck 105 of a bonding device while being held by mask substrate chuck 112.

Mask substrate chuck 112 is configured in the same manner as cassette 102 in order to maintain the shape of mask substrate 101. Supporting members $118_1$ and $118_2$, and leaf springs $113_1$ and $113_2$ having the same configuration as supporting members $108_1$ and $108_2$, and leaf springs $103_1$ and $103_2$, respectively, are provided on mask substrate chuck 112.

Mask substrate 101 and mask frame 104 are bonded together using adhesive $106_1$ and $106_2$. In order to prevent interference by supporting members $118_1$ and $118_2$, upper portions of circular plate-like mask frame 104 corresponding to supporting members $118_1$ and $118_2$ are cut out to provide grooves $107_1$ and $107_2$. By configuring mask substrate chuck 112 and mask frame 104 in such a manner, an external force is not applied to mask substrate 101 even while being bonded to mask frame 104, and therefore the amount of warp of mask substrate 101 is maintained.

Figure 2:
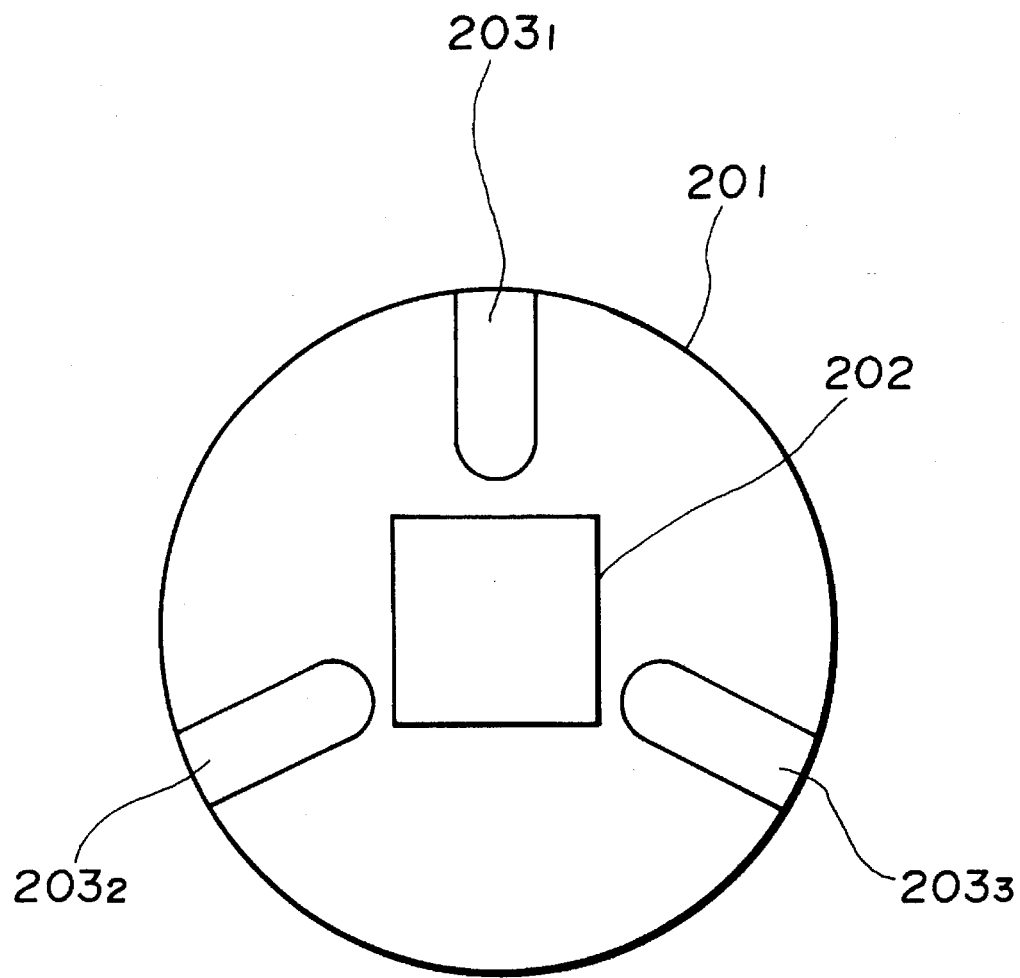
FIG. 2 is a plan view showing the shape of grooves formed in a mask frame.

FIG. 2 is a plan view showing the shape of grooves formed in a mask frame.

Mask frame 201 shown in FIG. 2 is to be combined with a mask substrate chuck having three supporting members 118. A rectangular or square opening 202 corresponding to the mask pattern formed on the mask substrate is formed in a central portion of mask frame 201. Three grooves $203_1$ through $203_3$ are provided from an outer circumferential edge toward the center of mask frame 201 with an equal interval therebetween to correspond to the respective supporting members of the mask substrate chuck.

Figure 3:
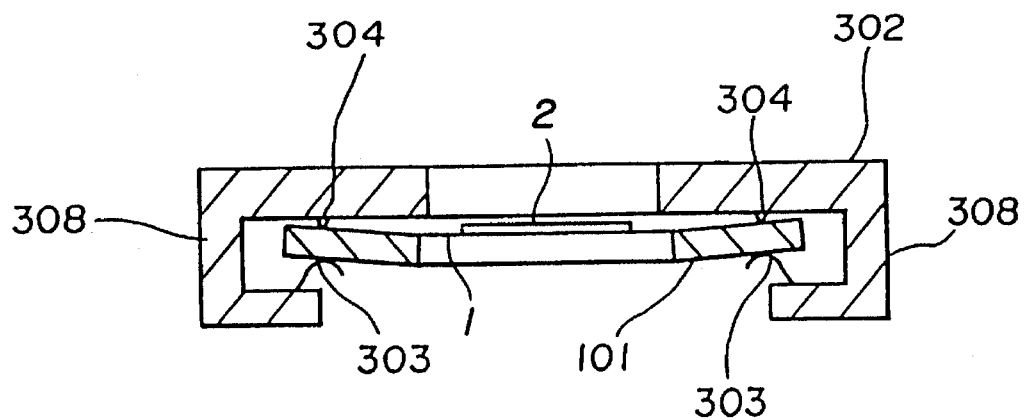
FIGS. 3(a) and 3(b) are cross-sectional views showing the configuration of a second preferred embodiment of the present invention.
Figure 3B:
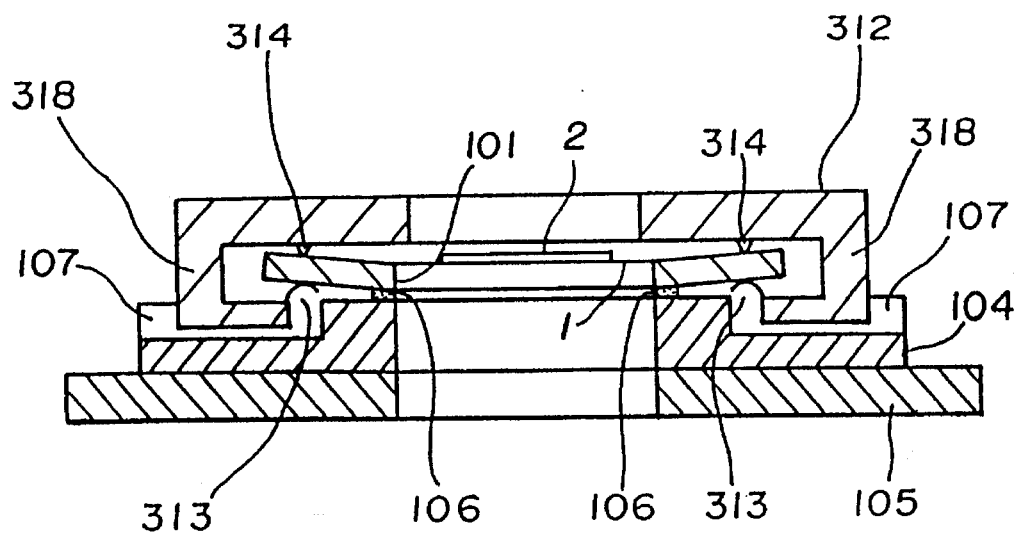

FIGS. 3(a) and 3(b) are cross-sectional views showing the configuration of a second preferred embodiment of the present invention. FIG. 3(a) illustrates a process of forming a mask pattern. FIG. 3(b) illustrates a process of bonding a mask substrate to a mask frame.

Three supporting members 308 are provided at outer circumferential portions of cassette 302 of the present embodiment with an equal interval therebetween. Three leaf springs 303 are provided on the inner surfaces of the respective supporting members 308 within cassette 302. Supporting posts 304 are provided on the inner surface of the upper plate of cassette 302 at positions corresponding to the respective leaf springs 303. Mask substrate 101 is held by being pressed against supporting posts 304 by leaf springs 303.

The three leaf springs 303 and supporting posts 304 are disposed on the circumference of a circle whose center coincides with the center of mask substrate 101 to be scanned with an electron beam, so that the amount of warp generated in mask substrate 101 does not change. The three supporting posts 304 are disposed so that the surface obtained by connecting the points at which supporting posts 304 contact mask substrate 101 is parallel to the reference surface of an electron beam scanning apparatus when cassette 302 is mounted in the apparatus.

Mask substrate 101 on which the mask pattern has been drawn is bonded to mask frame 104 provided on mask frame chuck 105 of a bonding device while being held by mask substrate chuck 312 having the same configuration as cassette 302.

Mask substrate chuck 312 is configured in the same manner as cassette 302 in order to maintain the shape of mask substrate 101. Supporting members 318, leaf springs 313 and supporting posts 314 having the same configuration as supporting members 308, leaf springs 303 and supporting posts 304, respectively, are provided on mask substrate chuck 312.

Mask substrate 101 and mask frame 104 are bonded together using adhesive 106 as in the first embodiment. Also in the present embodiment, as in the first embodiment, interference by supporting members 318 is prevented by grooves 107 formed in the upper surface of mask frame 104. Therefore, no external force is applied to mask substrate 101. Hence, mask substrate 101 is bonded to mask frame 104 while maintaining the amount of warp of mask substrate 101.

Figure 4:
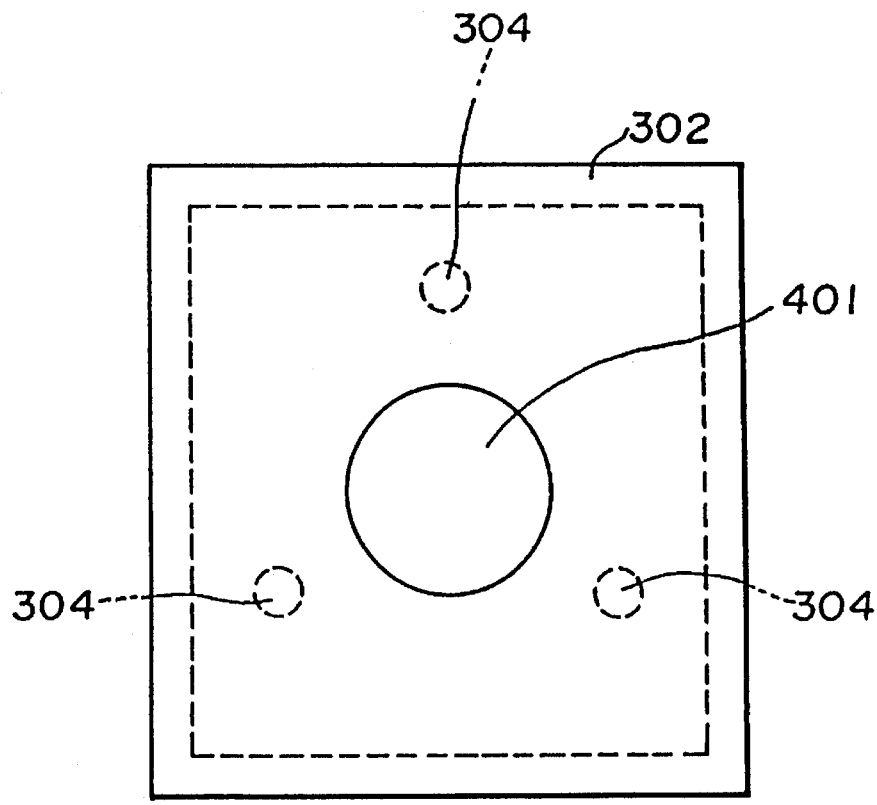
FIG. 4 is a top plan view showing a state of arrangement of supporting posts provided in a cassette in the second preferred embodiment.

FIG. 4 is a top plan view showing another state of arrangement of supporting posts provided on the cassette of the second embodiment.

Cassette 302 shown in FIG. 4 includes three supporting posts 304. A circular opening 401 corresponding to a mask pattern drawn on the mask substrate is formed in a central portion of cassette 302. The mask substrate is bonded to the mask frame using a mask substrate chuck having three supporting posts 314 at positions corresponding to the three supporting posts 304 shown in FIG. 4.

Figure 5:
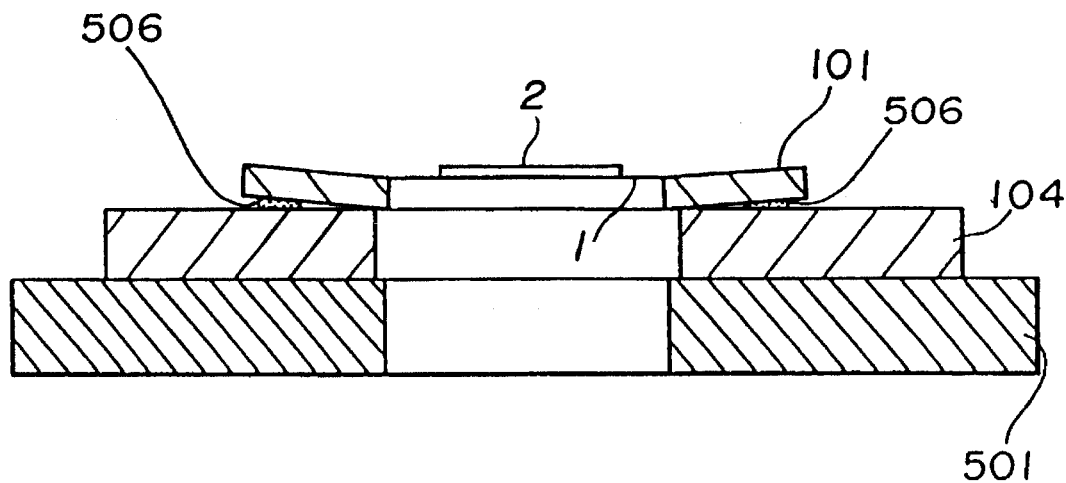
FIG. 5 is a diagram illustrating a state of mounting a mask substrate bonded to a mask frame in an X-ray exposure apparatus.

As shown in FIG. 5, mask substrate 101 and mask frame 104, which are bonded together by any of the methods of the above-described embodiments, are mounted in an X-ray exposure apparatus (not shown) via mask chuck 501, and are used for actual exposure. At that time, mask substrate 101 remains warped due to the tensile stress of the membrane, and the shape obtained when the mask pattern is formed by electron beam scanning is maintained. Hence, a pattern shift region is not produced, and excellent exposure can be performed.

Accuracy of exposure in the first embodiment shown in FIG. 1 is determined by the pressing positions of leaf springs $113_1$ and $113_2$, the degree of parallelism between the inner surface of the upper plate of cassette 102 and the reference surface of the electron beam scanning apparatus, and the like. Accuracy of exposure in the second embodiment shown in FIG. 2 is determined by the positions of the three leaf springs 303 and supporting posts 304, the degree of parallelism between the surface obtained by connecting the points at which supporting posts 304 contact mask substrate 101 and the reference surface of the electron beam scanning apparatus, and the like. Since mask substrate 101 is mounted in the exposure apparatus via mask chuck 501, accuracy of exposure is also determined by the degree of parallelism between the upper surface and the lower surface of mask chuck 501, the degree of parallelism of mask frame 104, and the like. It is necessary to very precisely control the above-described factors.

Figure 6:
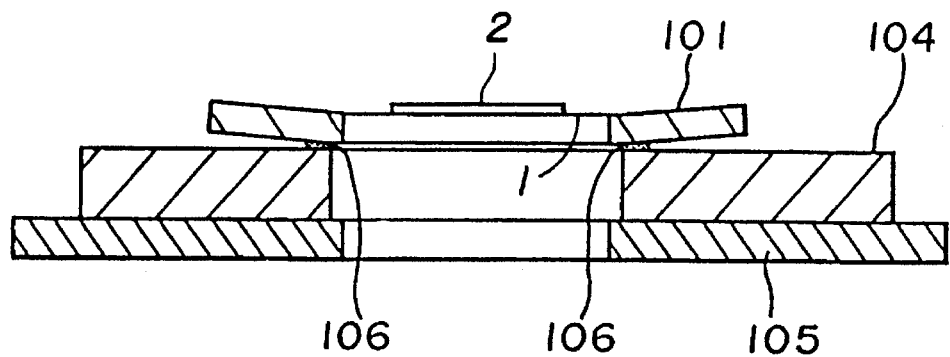
FIGS. 6(a) and 6(b) are cross-sectional views showing the configuration of a third preferred embodiment of the present invention.
Figure 6:
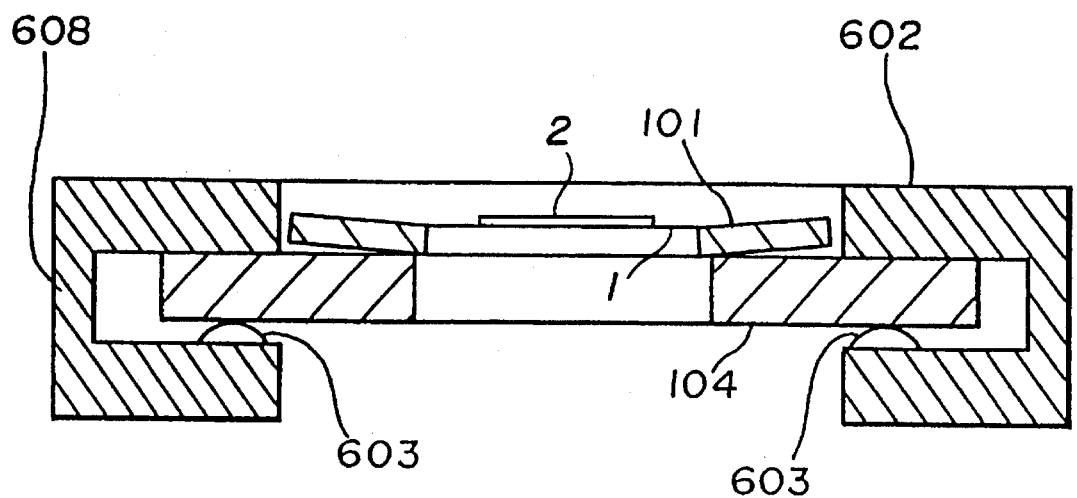

FIGS. 6(a) and 6(b) are cross-sectional views showing the configuration of a third preferred embodiment of the present invention.

In the embodiments shown in FIGS. 1 and 3, mask substrate 101 is bonded to mask frame 104 after exposing mask substrate 101 and forming an X-ray absorbing pattern on mask substrate 101. In the present embodiment, however, a pattern is drawn by an electron beam after bonding a mask substrate to a mask frame.

Mask substrate 101 shown in FIG. 6(a) is bonded to mask frame 104 using mask substrate chuck 112 shown in FIG. 1(b), mask substrate chuck 312 shown in FIG. 3(b), or the like.

Mask substrate 101 and mask frame 104 are bonded together as one body and are mounted in cassette 602 shown in FIG. 6(b), and mask substrate 101 is scanned with an electron beam.

Supporting members 608 are provided at outer circumferential portions of cassette 602 with an equal interval therebetween in the same manner as in the case of cassettes 102 and 302 of the above-described embodiments. At least two (preferably three) leaf springs 603 for pressing the upper surface of mask frame 104 against the inner surface of the upper plate of cassette 603 by contacting the lower surface of mask frame 104 are provided. The leaf springs are arranged on the inner surfaces of the supporting members 608 with equal intervals along the circumference of mask frame 104 therebetween. Mask substrate 101 thus mounted is scanned with an electron beam, and a mask pattern is drawn. Accordingly, an opening provided in cassette 602 for passing an electron beam must have dimensions to accommodate mask substrate 101. In the present embodiment, since mask substrate 101 is mounted in cassette 602 utilizing the upper surface of mask frame 104, which is very rigid, accuracy in mounting can be improved.

Mask substrate 101 on which the mask pattern has been drawn according to the above-described process and mask frame 104 bonded thereto are mounted as one body in an exposure apparatus via mask chuck 501 shown in FIG. 5, and are used for actual exposure.

Factors for determining accuracy of exposure in the present embodiment which are different from the above-described factors are the degree of parallelism between the inner surface of the upper plate of cassette 602 and the reference surface of the electron beam scanning apparatus, and the degree of flatness of the upper surface of mask frame 104. These factors must be very precisely controlled.

Figure 7:
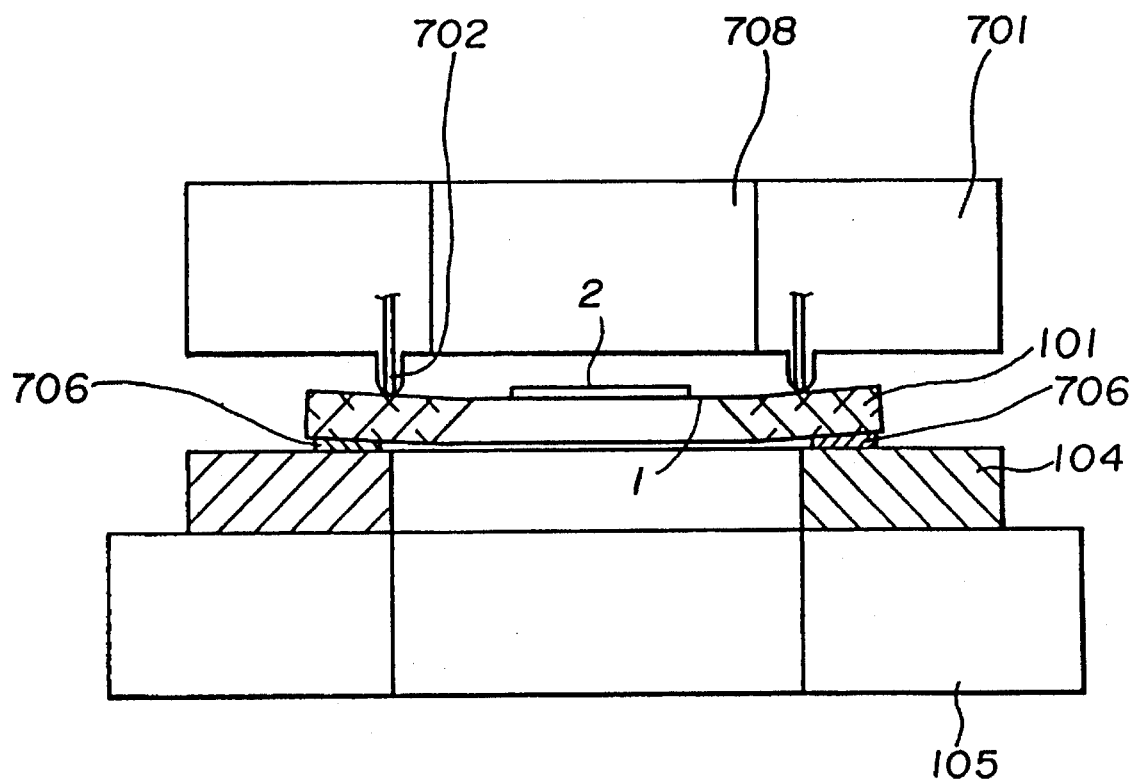
FIG. 7 is a cross-sectional view illustrating a substrate chuck for accurately performing a bonding process.

FIG. 7 is a cross-sectional view showing a substrate chuck for precisely performing a substrate bonding operation as shown in FIG. 6(a).

Mask substrate 101 is suctioned by substrate chuck 701 having a vacuum suctioning mechanism, and is bonded to mask frame 104 in a hanging state. Substrate chuck 701 has the shape of a circular plate, and includes at least two (preferably three) suction holes 702 for suctioning mask substrate 101 arranged on the circumference of a circle. In order to prevent the occurrence of distortion in mask substrate 101 when it is bonded to mask frame 104, suction holes 702 are provided in substrate chuck 701 with equal intervals therebetween on the circumference of a circle whose center coincides with the center of mask substrate 101. The diameter of this circle (on which suction holes 702 are disposed) equals the inner diameter of mask frame 104. An outer circumferential portion of mask substrate 101 is bonded to mask frame 104 by adhesive 706 in a state in which suction holes 702 are situated above the inner diameter of mask frame 104. Opening 708 is provided in a central portion of substrate chuck 701.

In the present embodiment, since mask substrate 101 is bonded to mask frame 104 in a hanging state, it is possible to very precisely control the height of a membrane on which a mask pattern is to be drawn with respect to mask frame 104, and to thereby improve accuracy of an exposure operation to be subsequently performed.

Figure 8A:
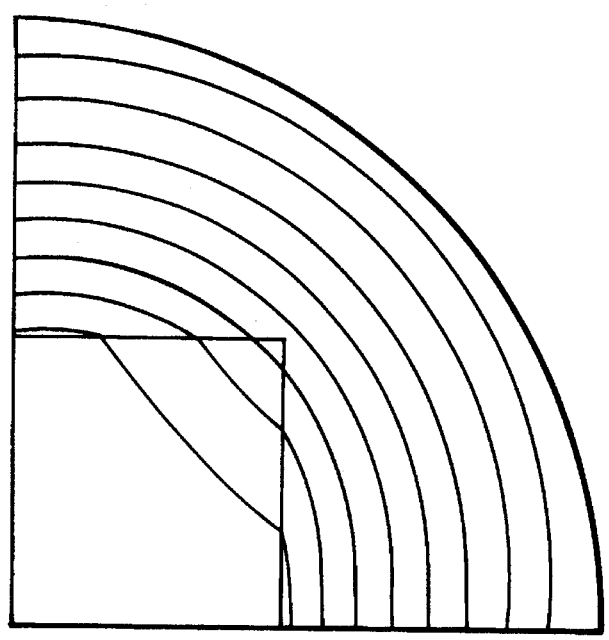
FIGS. 8(a) and 8(b) are diagrams illustrating contour lines for the amounts of warp of mask substrates.
Figure 8B:
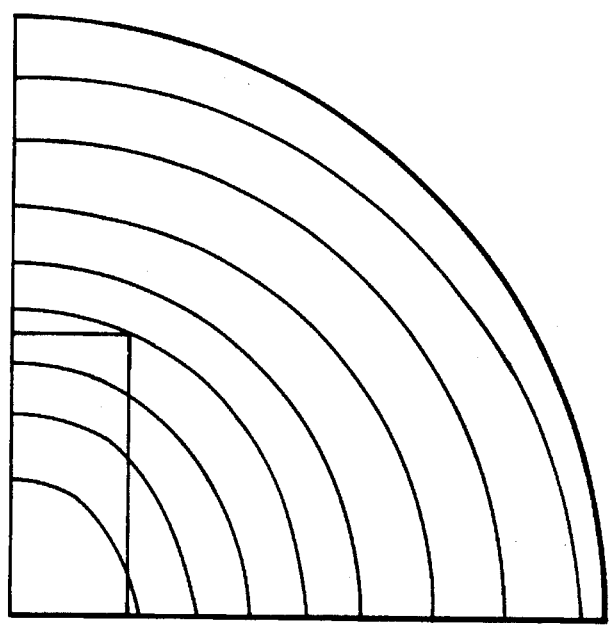

Next, a description will be provided of preferable bonding positions between a mask frame and a mask substrate. FIGS. 8(a) and 8(b) are diagrams illustrating contour lines indicating states of warp in a mask substrate which are obtained by the finite element method. Each of FIGS. 8(a) and 8(b) shows only ¼ of the mask substrate. The term "contour line" indicates a set of points having the same height with respect to a certain plane. The following planes are used as reference planes:

A plane including the neighborhood of the center of a membrane.

A plane including at least three points of the upper surface or the lower surface of the circumference of a supporting frame.

A plane including at least three points of the apices of a polygon formed at the border between a membrane and a supporting frame.

FIG. 8(a) represents the case of a square membrane, and FIG. 8(b) represents the case of a rectangular membrane. As can be understood from FIGS. 8(a) and 8(b), the contour lines for these two cases are different from each other. In the case of a square membrane, contour lines comprise substantially concentric circles. In the case of a rectangular membrane, however, contour lines comprise ellipses.

Figure 9A:
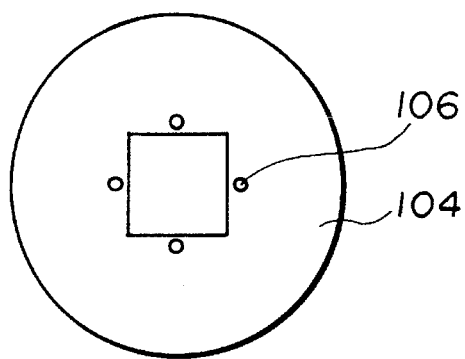
FIGS. 9(a) through 9(c) are diagrams illustrating examples of bonding between a mask substrate and a mask frame.
Figure 9B:
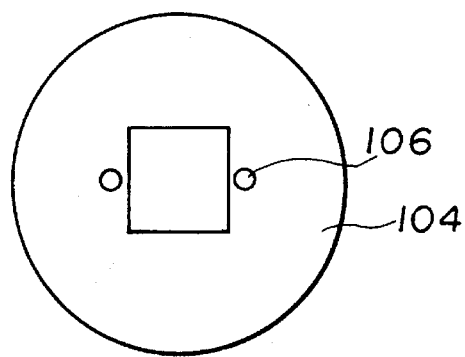
Figure 9C:
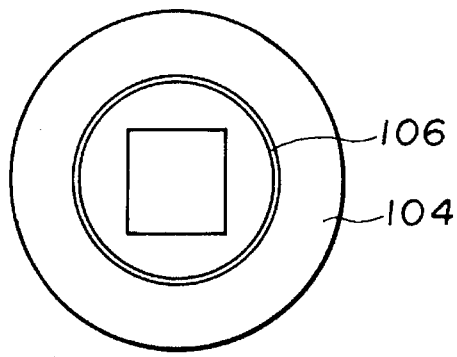

FIGS. 9(a) through 9(c) illustrate various bonding positions. FIG. 9(a) illustrates a case in which mask substrate 101 is bonded to mask frame 104 by applying adhesive 106 at four points on the same contour line of mask substrate 101. FIG. 9(b) illustrates a case in which mask substrate 101 is bonded to mask frame 104 at two points on the same contour line of mask substrate 101. FIG. 9(c) illustrates a case in which mask substrate 101 is bonded to mask frame 104 by applying adhesive 106 on a circle corresponding to a contour line of mask substrate 101. By thus bonding mask substrate 101 to mask frame 104 at a plurality of points (at least two points, or infinite points along the same contour line) on the same contour line, it is possible to perform bonding without altering the warped shape of mask substrate 101, and to suppress distortion in a mask pattern.

Figure 10A:
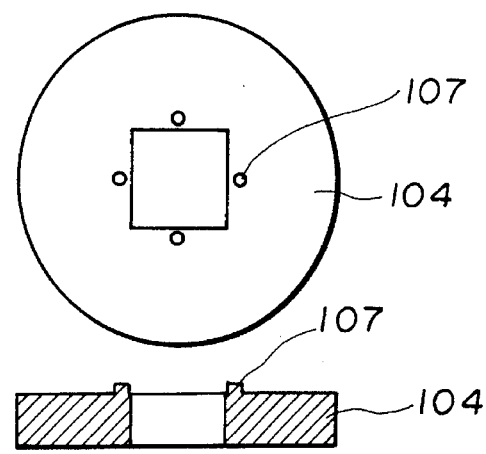
FIGS. 10(a) through 10(c) are diagrams illustrating further examples of bonding between a mask substrate and a mask frame.
Figure 10B:
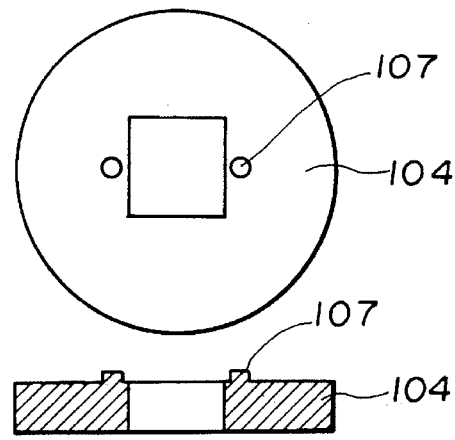
Figure 10C:
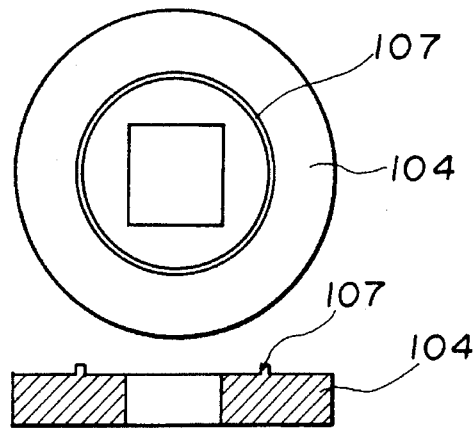

FIGS. 10(a) through 10(c) illustrate other examples of bonding. In FIG. 10(a), projections 107 are formed at four points on mask frame 104 along the same contour line of mask substrate 101. When an adhesive is applied on projections 107, and mask substrate 101 is bonded to mask frame 104, projections 107 function as spacers, and mask substrate 101 and mask frame 104 are bonded together only at the positions of projections 107. It is thereby possible to prevent uncertainty of bonded positions due to a spread of the adhesive. In FIG. 10(b), projections 107 are formed at two points on the same contour line. In FIG. 10(c), projections 107 are formed in the shape of a circle corresponding to a contour line.

Figure 11A:
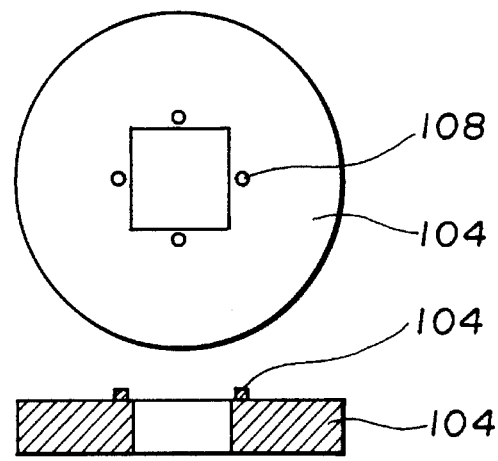
FIGS. 11(a) through 11(c) are diagrams illustrating still further examples of bonding between a mask substrate and a mask frame.
Figure 11B:
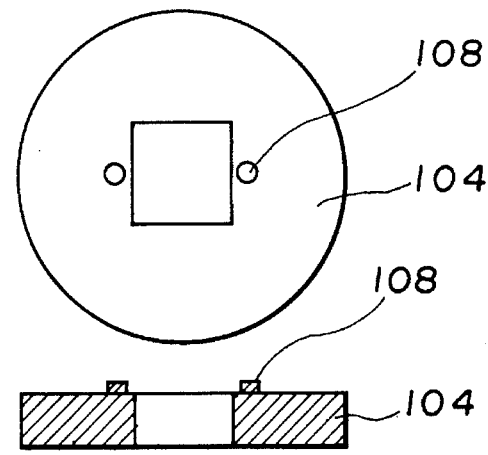
Figure 11C:
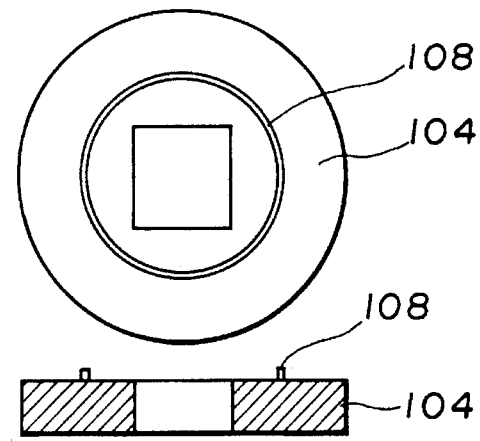
Figure 12A:
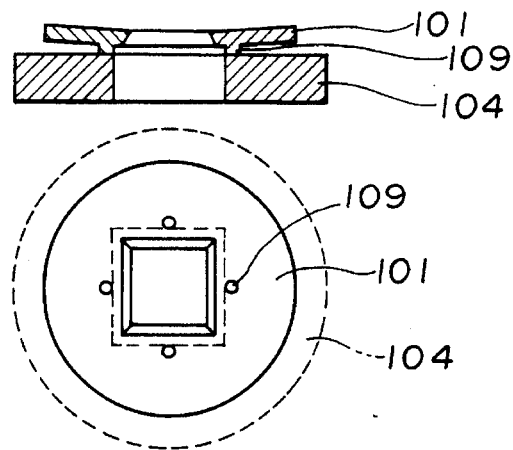
FIGS. 12(a) through 12(c) are diagrams illustrating still further examples of bonding between a mask substrate and a mask frame.
Figure 12B:
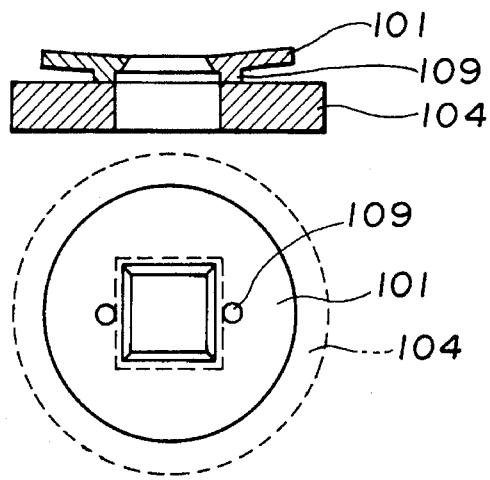
Figure 12C:
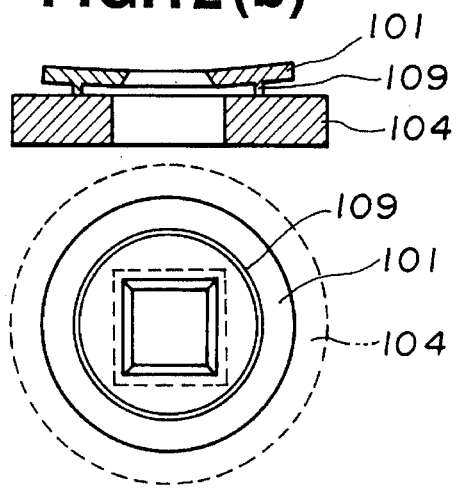

FIGS. 11(a) through 11(c) illustrate modified examples of FIGS. 10(a) through 10(c). In FIGS. 11(a) through 11(c), independent spacers 108 are provided on mask frame 104 in place of providing projections. FIGS. 12(a) through 12(c) illustrate other modified examples of FIGS. 10(a) through 10(c). In FIGS. 12(a) through 12(c), projections 109 are provided on mask substrate 101 as spacers. The arrangements of these spacers are the same as in FIGS. 10(a) through 10(c), and the same functions and effects as in the case of FIGS. 10(a) through 10(c) can be obtained.

Figure 13:
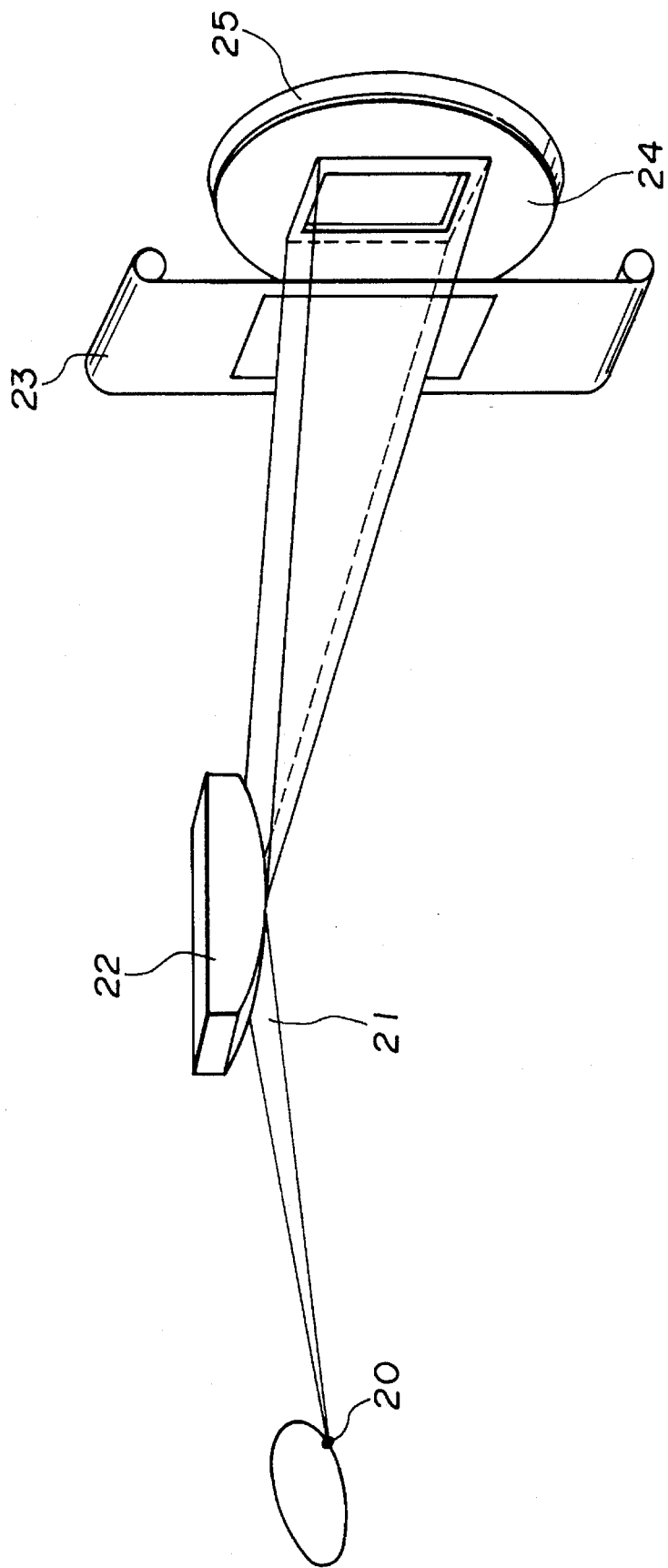
FIG. 13 is a diagram showing the configuration of an X-ray exposure apparatus according to a preferred embodiment of the present invention.

Next, a description will be provided of an X-ray exposure apparatus for producing devices (semiconductor devices, thin-film magnetic heads, micromachines or the like) which uses the above-described X-ray mask according to an embodiment of the present invention. FIG. 13 is a diagram showing the configuration of the X-ray exposure apparatus of the present preferred embodiment. In FIG. 13, synchrotron radiation light 21 having the shape of a sheet beam emitted from synchrotron radiation source 20 is spread in a direction perpendicular to the orbital plane of the radiation light by convex mirror 22. The radiation light reflected and spread by convex mirror 22 is adjusted by shutter 23 so that the amount of exposure is uniform within the irradiating region. The radiation light passing through shutter 23 is guided to X-ray mask 24. X-ray mask 24 is produced according to any of the methods of the above-described embodiments. The exposure pattern formed on X-ray mask 24 is exposed and transferred onto silicon wafer 25 which is coated with a resist by a step-and-repeat method, a scanning method or the like.

Next, a description will be provided of a semiconductor-device production method utilizing the above-described exposure apparatus according to an embodiment of the present invention.

Figure 14:
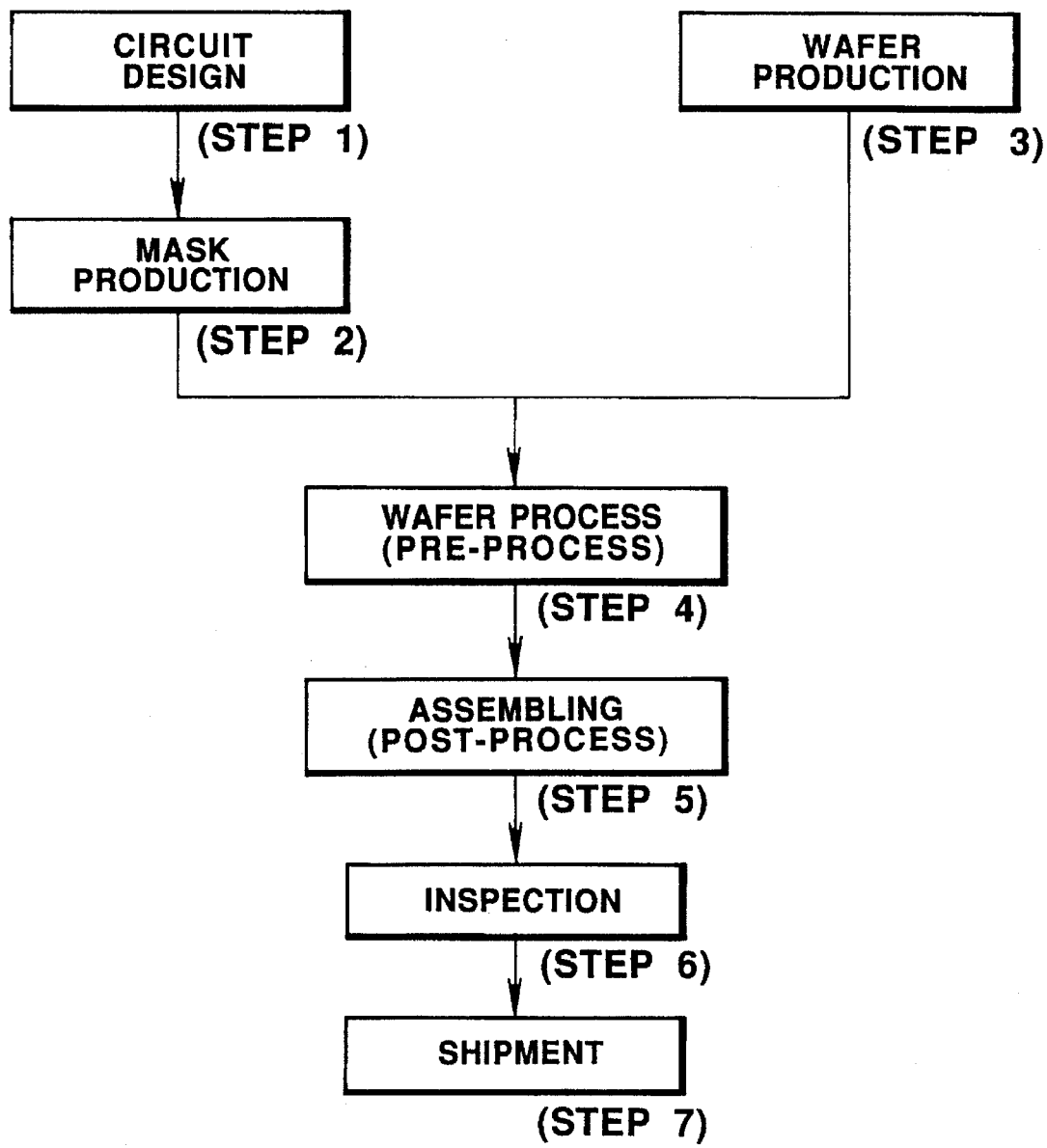
FIG. 14 is a diagram illustrating a production flow of semiconductor devices.

FIG. 14 shows a flow for producing semiconductor devices, such as semiconductor chips of IC's (integrated circuits), LSI's (large-scale integrated circuits) or the like, liquid-crystal panels, CCD's (charge-coupled devices), or the like. In step 1 (circuit design), circuit design of semiconductor devices is performed. In step 2 (mask production), masks on which designed circuit patterns are formed are produced. In step 3 (wafer production), wafers are produced using a material such as silicon or the like. Step 4 (wafer process) is called a pre-process, in which actual circuits are formed on the wafers by means of photolithography using the above-described masks and wafers. The next step, step 5 (assembling process), is called a post-process which produces semiconductor chips using the wafers produced in step 4, and includes an assembling process (dicing and bonding), a packaging process (chip encapsulation), and the like. In step 6 (inspection), inspection operations, such as operation-confirming tests, durability tests and the like are performed on the semiconductor devices produced in step 5. The production of semiconductor devices is completed after passing through the above-described processes, and the produced devices are shipped (step 7).

Figure 15:
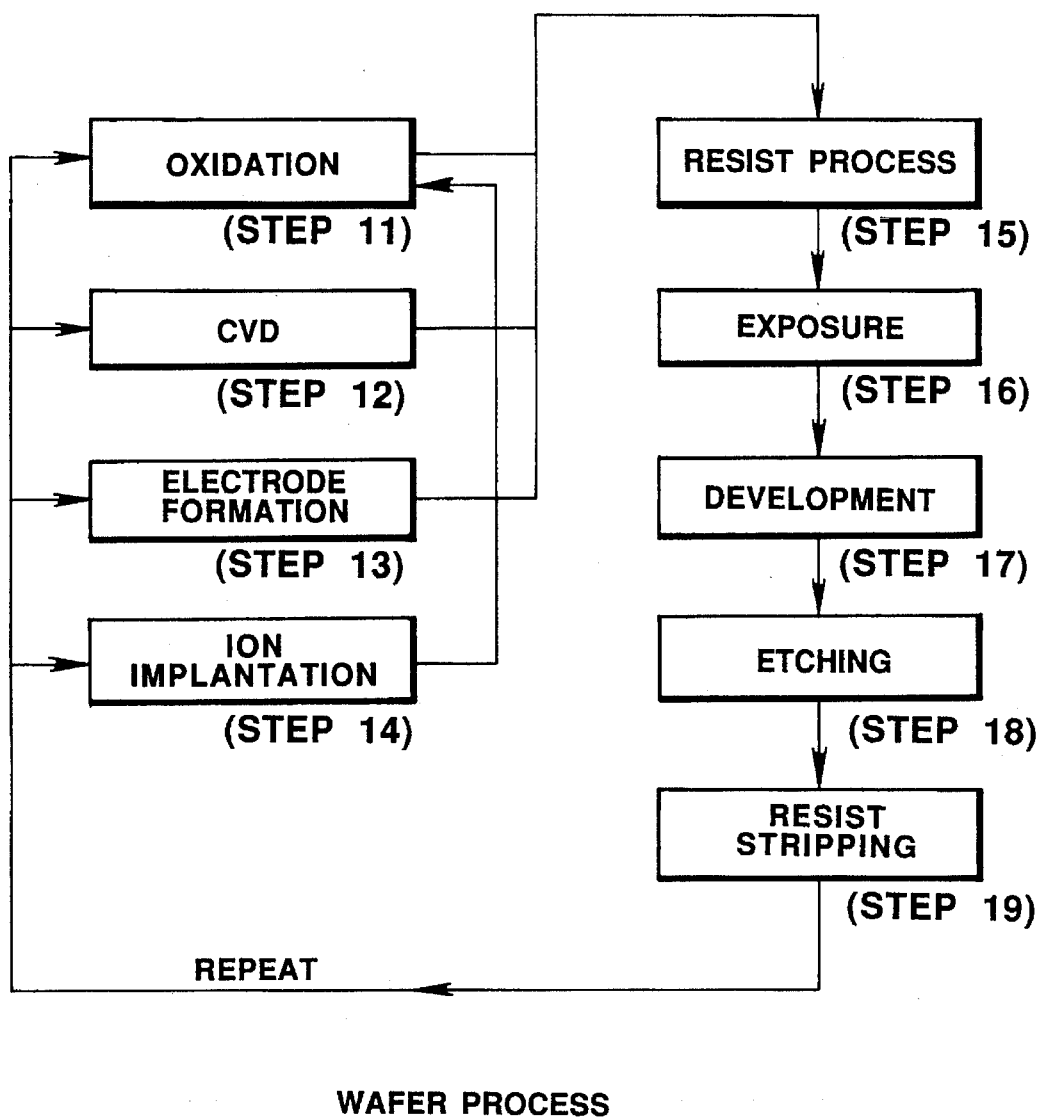
FIG. 15 is a diagram illustrating a detailed flow of a wafer process.

FIG. 15 shows the detailed flow of the above-described wafer process. In step 11 (oxidation), the surface of the wafer is oxidized. In step 12 (CVD), an insulating film is formed on the surface of the wafer. In step 13 (electrode formation), electrodes are formed on the surface of the wafer by vacuum deposition. In step 14 (ion implantation), ions are implanted into the wafer. In step 15 (resist process), a photosensitive material is coated on the wafer. In step 16 (exposure), the circuit pattern on the mask is exposed and printed on the wafer by the above-described x-ray exposure apparatus. In step 17 (development), the exposed wafer is developed. In step 18 (etching), portions other than the developed resist image are etched off. In step 19 (resist stripping), the resist which becomes unnecessary after the completion of the etching is removed. By repeating these steps, a final circuit pattern made of multiple patterns is formed on the wafer.

The individual components shown in outline or designated by blocks in the Drawings are all well-known in the X-ray mask and exposure apparatus arts and their specific construction and operation are not critical to the operation or best mode for carrying out the invention.

While the present invention has been described with respect to what is presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation to encompass all such modifications and equivalent structures and functions.

What is claimed is:

1. An X-ray mask, comprising:

a mask substrate having a transparent portion, said mask substrate having an amount of warp;

a membrane held on the substrate, said membrane having a pattern at a position corresponding to the transparent portion; and a mask frame for holding said mask substrate such that the amount of warp in said mask substrate is preserved.

2. An X-ray mask according to claim 1, wherein the transparent portion of said mask substrate is formed by a back-etching processing of said mask substrate.

3. A method of producing an X-ray mask comprising the steps of:

providing a mask frame;

providing a mask substrate with a membrane, the membrane having a pattern to be transferred, wherein the mask substrate pattern to be transferred has a predetermined internal stress; and bonding the mask frame and the mask substrate while preserving the predetermined internal bias stress of the mask substrate.

4. A method according to claim 3, further comprising back-etching a portion of the mask substrate with the membrane, thereby causing the mask substrate to have the predetermined internal stress.

5. An X-ray mask comprising:

a mask substrate having a transparent portion, said mask substrate having a plurality of contour lines;

a membrane held on said mask substrate, said membrane having a pattern at a position corresponding to the transparent portion; and a mask frame bonded to said mask substrate at a plurality of points, which are located on a single one of the plurality of contour lines of said mask substrate.

6. An X-ray mask according to claim 5, further comprising at least one spacer disposed between said mask substrate and said mask frame and located on said one of the plurality of contour lines.

7. An X-ray mask according to claim 5, further comprising at least one projection disposed between said mask substrate and said mask frame and located on said one of the plurality of contour lines.

8. A method of producing an X-ray mask, comprising the steps of:

providing a mask substrate having a membrane;

back-etching a portion of the mask substrate, thereby the mask substrate having an amount of warp;

forming a pattern on the membrane while preserving the amount of warp of the mask substrate; and bonding a mask frame to the mask substrate while preserving the amount of warp of the mask substrate, whereby distortion of the pattern is prevented.

9. A method according to claim 8, wherein said bonding step is performed before said forming step.

10. A method according to claim 8, wherein said forming step comprises drawing the pattern using an electron beam.

11. A method according to claim 8, wherein said bonding step comprises:

supporting the mask substrate using a mask substrate chuck;

supporting the mask frame using a mask frame chuck; and joining the mask frame and the mask substrate using an adhesive.

12. An X-ray mask produced by a method comprising the steps of:

providing a mask substrate having a membrane;

back-etching a portion of the mask substrate, thereby the mask substrate having an amount of warp;

forming a pattern on the membrane while preserving the amount of warp of the mask substrate; and bonding a mask frame to the mask substrate while preserving the amount of warp of the mask substrate, whereby distortion of the pattern is prevented.

13. A method of manufacturing a micro-device, said method comprising the steps of:

providing an X-ray mask comprising (i) a mask substrate having a transparent portion, the mask substrate having an amount of warp (ii) a membrane held on the substrate, said membrane having a pattern at a position corresponding to the transparent portion; and (iii) a mask frame for holding said mask substrate such that the amount of warp in said mask substrate is preserved; and exposing said X-ray mask with radiation to transfer the pattern onto a wafer.

14. A method according to claim 13, wherein said exposing step comprises a step-and-repeat method.

15. A method according to claim 13, wherein said exposing step comprises a scanning method.

16. A method according to claim 13, further comprising performing post-exposure processing of the wafer comprising at least one of an assembling process, a packaging process and an inspection process.

* * * * *